United States Patent [19]

Nakabayashi

[11] Patent Number: 4,799,014

[45] Date of Patent: Jan. 17, 1989

[54] METHOD OF SETTING CONDITIONS OF HIGH-FREQUENCY MAGNETIC FIELD

[75] Inventor: Kazuto Nakabayashi, Ootawara, Japan

[73] Assignee: Kabushiki Kaisha Toshiba, Kawasaki, Japan

[21] Appl. No.: 131,433

[22] Filed: Dec. 11, 1987

[30] Foreign Application Priority Data

Dec. 15, 1986 [JP]  Japan .............................. 61-296567

[51] Int. Cl.$^4$ ............................................ G01R 33/20
[52] U.S. Cl. ..................................... 324/314; 324/313
[58] Field of Search ............... 324/300, 307, 309, 311, 324/312, 313, 314, 318, 322; 128/653

[56] References Cited

U.S. PATENT DOCUMENTS

| | | | |
|---|---|---|---|
| 4,345,207 | 8/1982 | Bertrand et al. | 324/314 |
| 4,443,760 | 4/1984 | Edelstein et al. | 324/314 |
| 4,543,529 | 9/1985 | Mee et al. | 324/314 |
| 4,675,608 | 6/1987 | Hanawa et al. | 324/314 |
| 4,703,267 | 10/1987 | Maudsley | 324/314 |
| 4,739,267 | 4/1988 | Leroux et al. | 324/314 |

Primary Examiner—Michael J. Tokar
Attorney, Agent, or Firm—Foley & Lardner, Schwartz, Jeffery, Schwaab, Mack, Blumenthal & Evans

[57] ABSTRACT

In a method of setting the intensity of a high-frequency magnetic field, in order to adjust and set a field intensity of the high-frequency magnetic field in a magnetic resonance imaging system, an amplitude of an excitation high-frequency magnetic field pulse is sequentially changed; magnetic resonance excitation and reading of a magnetic resonance signal are repeatedly performed; and the amplitude of the high-frequency magnetic field pulse, which corresponds to a maximum or minimum value of the magnetic resonance signal of the signals obtained by a plurality of excitation cycles, is used as a reference to set the intensity of the high-frequency magnetic field. An opposite phase high-frequency magnetic field pulse, having the same amplitude as that of the excitation high-frequency magnetic field pulse, and having a carrier wave which is 180° out of phase with respect to that of the excitation high-frequency magnetic field pulse, is applied to an object after reading of the magnetic resonance signal is completed and before the next magnetic resonance cycle is started.

5 Claims, 2 Drawing Sheets

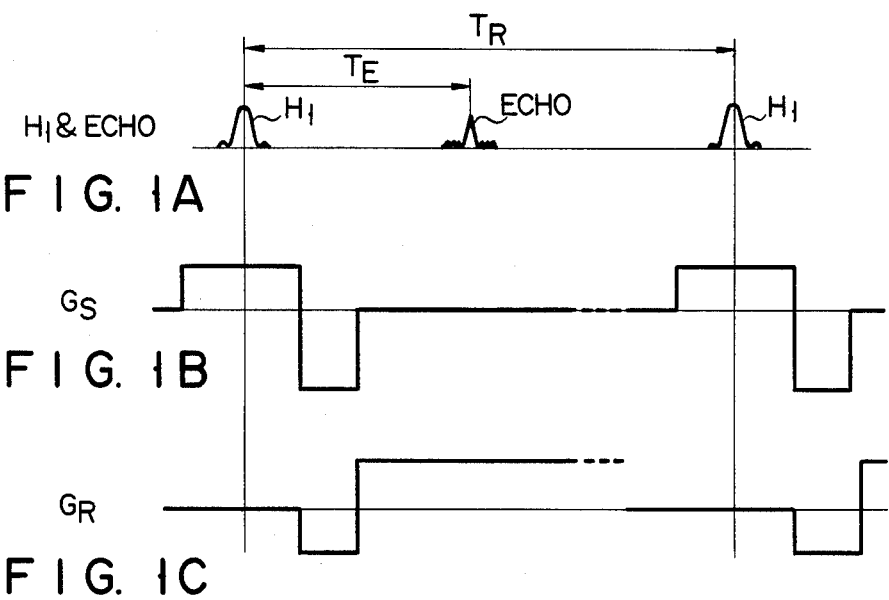
FIG. 1A
FIG. 1B
FIG. 1C
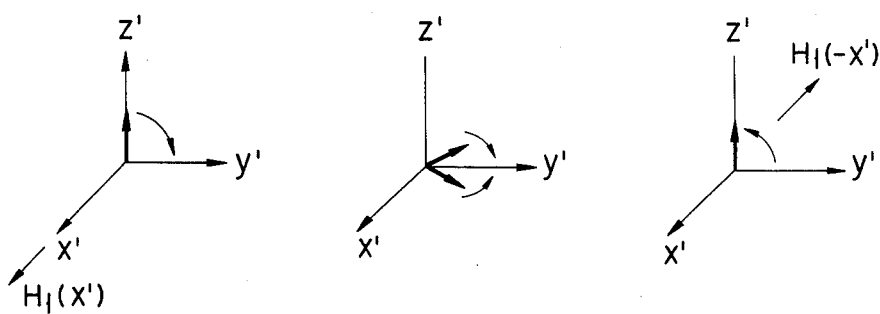
FIG. 3A  FIG. 3B  FIG. 3C

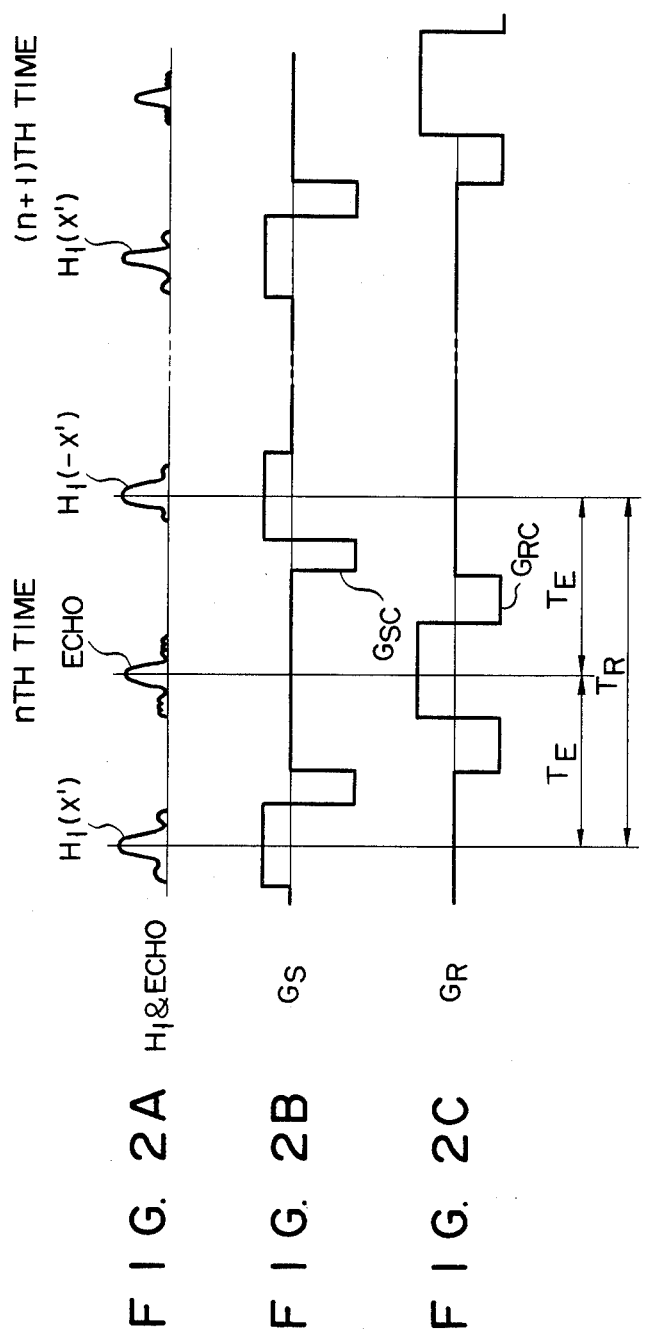

METHOD OF SETTING CONDITIONS OF HIGH-FREQUENCY MAGNETIC FIELD

BACKGROUND OF THE INVENTION

The present invention relates to an improvement in a method of setting the conditions of a high-frequency (normally, radio frequency (RF)) magnetic field (so-called excitation pulse) applied to an object to be examined so as to excite magnetic resonance in a magnetic resonance imaging (MRI) system, a computer is used to process information on the basis of a specific atomic nucleus spin at a selected slice, i.e., a portion of interest in the object, by using a magnetic resonance phenomenon of the atomic nucleus spin. The processed information is used to reconstruct an image.

A conventional diagnostic MRI system produces a tomographic image of a selected portion of an object to be examined, i.e., a living subject. The object is placed in a uniform static magnetic field. A pulsed gradient field is superposed on the static magnetic field. A steady gradient field may be used in place of the pulsed gradient field. In addition to the static and gradient fields, in order to excite magnetic resonance, a pulsed high-frequency magnetic field must be applied in a direction perpendicular to the static magnetic field. In the MRI system, a magnetic resonance (MR) signal generated by the excited magnetic resonance is detected and processed, and a tomographic image of a specific portion, selected by a combination of the gradient field, and the high-frequency magnetic field is obtained.

The high-frequency magnetic field includes excitation pulses called 90° and 180° pulses. The 90° pulse is a high-frequency component for exciting the magnetic resonance to rotate a magnetic moment of a spin system (i.e., a nucleus spin) through 90° until the magnetic moment is changed from a direction parallel to the static magnetic field to a direction perpendicular thereto. The 180° pulse is a high-frequency component for rotating the magnetic moment of the spin system through 180° in a direction antiparallel to the direction of the static magnetic field.

When 90° and 180° conditions of these high-frequency excitation pulses (i.e., the RF pulses), that is, flip angles determined by the RF pulses, are accurately set, an MR signal having a high S/N (signal-to-noise) ratio can be obtained. Therefore, setting the conditions of the flip angle of the RF pulses is very important.

A Q (quality factor) value of a transmission coil system is changed according to attributes (e.g., adult or child, and fat or slender) of an object, that is, the shape and/or size of the object. When an RF pulse having a predetermined power is applied to different objects, flip angle conditions vary depending on the different objects.

In order to obtain RF pulses for accurately setting a flip angle of 90° or 180° for each examination or photographing cycle in the conventional MRI system, prescanning is performed prior to main scanning in every photographing cycle so that a spin echo signal has a maximum level.

For example, echo signals are acquired by a pulse sequence shown in FIGS. 1A to 1C to set the intensity of a high-frequency magnetic field. More specifically, $H_1$ in FIG. 1A shows an exciting RF pulse; $T_E$, a time required until an echo signal is read upon application of exciting RF pulse $H_1$; and $T_R$, a repetition time of RF pulse $H_1$.

If longitudinal and transverse relaxation time constants of the spin are defined as $T_1$ and $T_2$, respectively, signal intensity S at time $t = T_E$ which satisfies the condition $TR > T_1, T_2$ is proportional to y'-axis component My' of magnetization as follows:

$$S \propto My' \quad (1)$$

$$My' = M_0' \sin\theta \exp\{-(T_E/T_1)\} \quad (2)$$

where $M_0'$ is initial magnetization, i.e. the thermal equilibrium magnetization.

The amplitude of RF pulse $H_1$ is changed and scanning is performed a plurality of times to obtain echo signals. A point (the amplitude of RF pulse $H_1$) for maximizing the echo signal is selected to obtain amplitude conditions of the 90° RF pulse.

In order to obtain the maximum value of the signal as described above, the input power level is changed to perform scanning a plurality of times and the maximum value of the echo signal is obtained. When an object including a component having long longitudinal relaxation time $T_1$ is to be examined, the excitation repetition time must be sufficiently prolonged (e.g., $TR = 3T_1$) in order to prevent the influence of $T_1$. Repetition time $T_R$ is thus normally set to be 2 seconds or longer. Therefore, in order to set the conditions of the 90° and 180° RF pulses, a period of one minute or more is required.

Main scanning time has been shortened in recent years. Therefore, the long prescanning time prior to main scanning is the largest obstacle against reduction in the total scanning time.

SUMMARY OF THE INVENTION

It is an object of the present invention to provide a method of setting a high-frequency magnetic field so as to greatly shorten excitation repetition time in an MRI system when conditions for excitation high-frequency magnetic field pulses are being adjusted and set to obtain a predetermined flip angle.

According to the method of setting a high-frequency magnetic field in an MRI system, the amplitude of the excitation high-frequency magnetic field pulse is changed and this pulse is applied to cause magnetic resonance, and then a magnetic resonance signal is read out. This process is repeated a plurality of times. After each read cycle of the magnetic resonance signal, an opposite phase high-frequency magnetic field pulse having the same amplitude as that of the excitation high-frequency magnetic field pulse and a carrier wave 180° out of phase with respect to that of the excitation high-frequency magnetic field pulse is applied to the object. The high-frequency magnetic field is set using pulse amplitudes corresponding to maximum or minimum levels of the magnetic resonance signal.

According to the conventional pulse sequence method, it is impossible to find accurate 90° and 180° conditions according to the signal magnitudes by repeatedly applying the pulse at short repetition times $T_R$ because magnetization vectors, excluding the Mz' vector as the z'-axis magnetization vector, are present at the start of pulse application.

According to the method of the present invention, every time a signal read operation is completed, the opposite phase high-frequency magnetic field pulse having the same amplitude as that of the excitation high-frequency magnetic field pulse and a carrier wave 180° out of phase with respect to that of the excitation high-frequency magnetic field pulse is applied to the object. Therefore, at the start of application of the excitation high-frequency magnetic field pulse, only the $Mz'$ vector component is present. Even if the condition $T_R > T_1, T_2$ is not satisfied, the accurate conditions can be obtained by the magnitudes of the signal. According to the method of the present invention, the change in amplitude of the high-frequency magnetic field pulse is equivalent to the change in transmission power. Therefore, the method of the present invention is suitably applied to a magnetic resonance imaging system having an auto power control function, as disclosed in U.S. Pat. No. 4,675,608.

According to the method of setting the high-frequency magnetic field of the present invention, the repetition time can be greatly shortened when conditions for obtaining an accurate flip angle of the high-frequency magnetic field pulse are being set.

BRIEF DESCRIPTION OF THE DRAWINGS

FIGS. 1A, 1B, and 1C are timing charts for explaining a conventional pulse sequence for setting a high-frequency magnetic field intensity;

FIGS. 2A, 2B, and 2C are timing charts for explaining a pulse sequence for setting a high-frequency magnetic field; and FIGS. 3A, 3B, and 3C are views for explaining spin states in the sequence of FIGS. 2A, 2B, and 2C.

DETAILED DESCRIPTION OF THE PREFERRED EMBODIMENT

FIGS. 2A to 2C show a pulse sequence according to a method of an embodiment of the present invention for setting a high-frequency magnetic field.

The pulse sequence illustrated in FIGS. 2A through 2C is obtained by modifying the pulse sequence of the so-called gradient echo method and differs from this method in the following points:

(1) After the echo signal is read out, the opposite phase RF pulse $H_1(-x')$, having the same amplitude as that of the excitation high-frequency magnetic field pulse, i.e., RF pulse $H_1(x')$ and being 180° out of phase, is applied to the object.

(2) Gradient fields $G_{SC}$ and $G_{RC}$ are generated prior to the application of RF pulse $H_1(-x')$.

By operation (1) according to the method of the present invention, only the $Mz'$ vector is present at the begining of the excitation RF pulse $H_1(x')$ application.

Operation (2) in which gradient fields $G_{SC}$ and $G_{RC}$ are generated, is not essential in the present invention. However, if the repetition time is shortened compared with transverse relaxation time $T_2$, the influence of the transverse magnetization component remains at the time of application of the next RF pulse. Therefore, the transverse magnetic component is refocused by operation (2).

In the pulse sequence shown in FIGS. 2A through 2C, RF pulse $H_1(x')$ and slicing gradient field $G_S$ are applied together to the object while it is laying in a predetermined static magnetic field. Gradient field $G_S$ is inverted and removed. At the same time, an inverted field of read gradient field $G_R$ is applied to the object. Gradient field $G_R$ is then re-inverted and applied to the object in order to acquire magnetic resonance echo signals. Gradient field $G_R$ is then inverted again and gradient field $G_{RC}$ is applied to cancel field $G_R$. After inverted gradient field $G_{SC}$ of gradient field $G_S$ is applied to the object, it is inverted once more so that gradient field $G_S$ is applied again to the object. At the same time, opposite phase RF pulse $H_1(-x')$ is also applied to the object. Gradient field $G_S$ is then canceled, and the initial state is restored. The above sequence is repeated a plurality of times.

The above pulse sequence is repeated while the RF pulse $H_1(x')$ amplitude is gradually increased. Therefore, gradient echo signals can be acquired a plurality of times.

The spin state during repetition scanning is shown in FIGS. 3A through 3C. RF pulse $H_1(x')$ is applied together with gradient field $G_S$ along the $x'$-axis in FIG. 3A. If the RF pulse $H_1(x')$ satisfies the 90° condition, the spin along the $z'$-axis, as the direction of the static magnetic field, is turned 90°. Gradient field $G_S$ is inverted and gradient field $G_R$ is applied to the object in the opposite direction. Gradient field $G_R$ is then inverted and gradient field $G_R$ is applied to the object in a predetermined direction. Spins, dispersed upon application of RF pulse $H_1(x')$, are concentrated on the $y'$-axis, as shown in FIG. 3B. When those dispersed spins are concentrated on the $y'$-axis and the echo level becomes maximum, echo signals are acquired. Upon application of gradient fields $G_{SC}$ and $G_{RC}$, the transverse magnetization component is refocused before the opposite phase RF pulse $H_1(-x')$ is applied to the object. Therefore, spins are perfectly aligned with the $y'$-axis of the rotary coordinate system (i.e., $Mz'=0$, $Mx'=0$, and $My'=M$). In this state, RF pulse $H_1(-x')$ having directionality corresponding to the direction in FIG. 3C is applied in combination with gradient field $G_S$ to the object. Spins are reset in a state wherein all magnetization components are aligned with the $z'$-axis. When the next RF pulse $H_1(x')$ is applied in the next scanning cycle, only magnetization component $Mz'$ is present. The next scanning can be performed without being adversely affected by longitudinal and transverse relaxation time constants $T_1$ and $T_2$. Of the echo signals obtained by a plurality of scanning cycles, the amplitude of the RF pulse providing the maximum echo signal is used to accurately calculate the 90° flip condition. The scanning (excitation) repetition time can be shortened without adversely affecting signal acquisition as compared to the 90°–180° pulse sequence repetition time of the conventional system. Therefore, the adjustment time in setting the high-frequency magnetic field intensity can be decreased to 1/20 to 1/30 that of the conventional system.

Once the 90° pulse condition is determined, the RF pulse condition for obtaining other flip angles can easily be calculated in a proportional relationship. For example, in order to obtain the 180° pulse condition, the amplitude of the 90° pulse is doubled.

The present invention is not limited to the particular embodiment described above. Various changes and modifications may be made within the spirit and scope of the invention.

In the above embodiment, the RF pulse is a 90° pulse which is used in prescanning for adjustment. A amplitude providing a maximum magnitude of the echo signal serves as a condition for obtaining the 90° flip angle, and other RF pulse conditions such as the 180° pulse condition are defined on the basis of this amplitude. However, the present invention is not limited to this. If the 180° pulse is used as the excitation RF pulse, an amplitude providing a minimum magnitude of the echo signal may be used as a 180° condition, and the amplitude of the RF pulse, i.e., the high-frequency magnetic field intensity, may be determined on the basis of the minimum amplitude.

In the above embodiment, the gradient echo method is employed. However, the present invention may also be applied to a pulse echo method, i.e., a 90°–180° pulse sequence. In this case, a gradient field and an RF pulse are applied to the object in accordance with a symmetrical sequence with the echo signal sequence along the time base. The carrier wave of the RF pulse, after the acquisition of the echo signal, must have the opposite phase to that of the RF pulse before the echo signal acquisition.

In the above embodiment, in order to obtain a high-precision echo signal by increasing an S/N ratio during prescanning echo signal acquisition, the refocusing gradient field is applied to the object in a symmetrical manner using the echo as the center along the time base. However, refocusing is not essential in the present invention and need not be performed. In this case, if an RF pulse, having a phase opposite to that applied before echo signal generation, is applied after echo signal acquisition in a symmetrical manner by using the echo as the center along the time base, the object of the present invention is achieved.

What is claimed is:

1. A method of setting the intensity of a high-frequency magnetic field in order to adjust and set a field intensity of the high-frequency magnetic field in a magnetic resonance imaging system, comprising the steps of:
   (a) sequentially changing the amplitude of an excitation high-frequency magnetic field pulse,
   (b) repeatedly performing magnetic resonance excitation and reading of a magnetic resonance signal, and
   (c) utilizing as a reference in setting the intensity of the high-frequency magnetic field the amplitude of the high-frequency magnetic field pulse, which corresponds to one of the maximum and minimum values of the magnetic resonance signal obtained by a plurality of excitation cycles, and
   (d) applying an opposite phase high-frequency magnetic field pulse, having the same amplitude as that of the excitation high-frequency magnetic field pulse, and having a carrier wave which is 180° out of phase with respect to that of the excitation high-frequency magnetic field pulse, to an object after reading of the magnetic resonance signal is completed and before the next excitation cycle started.

2. A method according to claim 1, further including the step of applying the opposite phase high-frequency magnetic field pulse to the object at a timing symmetrical with that of the excitation high-frequency magnetic field pulse by using each magnetic resonance signal as a center along a time base, and applying a gradient field to the object in a symmetrical manner by using the magnetic resonance signal as the center along the time base after reading of each said magnetic resonance signal.

3. A method according to claim 1, wherein the magnetic resonance signal is a spin echo signal obtained by magnetic resonance.

4. A method of adjusting and setting a field intensity of a high-frequency magnetic field in a magnetic resonance imaging system, comprising:
   (1) the first step of applying an excitation high-frequency magnetic field pulse to the object to be examined;
   (2) the second step of reading a magnetic resonance signal induced into the object;
   (3) the third step of applying an opposite phase high-frequency magnetic field pulse having the same amplitude as that of the excitation high-frequency magnetic field pulse and having a carrier wave which is 180° out of phase with respect to that of the excitation high-frequency magnetic field pulse;
   (4) the fourth step of sequentially changing the amplitude of the excitation high-frequency magnetic field pulse and repeating the first through third steps;
   (5) the fifth step of determining the magnitude of one of the maximum and minimum values of a signal from a plurality of magnetic resonance signals obtained in the fourth step and obtaining an amplitude of the excitation high-frequency magnetic field pulse which corresponds to the determined magnitude; and
   (6) the sixth step of setting intensity of the high-frequency magnetic field by using, as a reference, the amplitude obtained in the fifth step.

5. A method according to claim 4, wherein the first step includes the step of applying a slicing gradient field of a first direction together with the excitation high-frequency magnetic field pulse; a seventh step is provided between the first and second steps to invert and cancel the gradient field of the first direction and apply to the object a gradient field of a second direction which is obtained by inverting a read gradient field; the second step includes the step of acquiring the echo signals, inverting the gradient field of the second direction, and applying a read gradient field to the object; an eighth step is provided between the second and third steps to invert and cancel the gradient field of the second direction and to apply a gradient field, inverted with respect to the gradient field of the first direction, to the object; and the third step includes the step of applying the opposite phase high-frequency magnetic field pulse and a further inverted gradient field of the first direction to the object.

* * * * *